(12) United States Patent
Aitken et al.

(10) Patent No.: US 6,366,075 B1
(45) Date of Patent: Apr. 2, 2002

(54) FIBER OPTIC, CURRENT MEASURING DEVICES AND METHOD

(75) Inventors: Bruce G. Aitken, Corning; Nicholas F. Borrelli, Elmira; Lauren K. Cornelius, Painted Post; James J. Price; Paul A. Tick, both of Corning, all of NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 09/623,190

(22) PCT Filed: Feb. 9, 1999

(86) PCT No.: PCT/US99/02752

§ 371 Date: Aug. 29, 2000

§ 102(e) Date: Aug. 29, 2000

(87) PCT Pub. No.: WO99/47938

PCT Pub. Date: Sep. 23, 1999

Related U.S. Application Data

(60) Provisional application No. 60/078,161, filed on Mar. 16, 1998.

(51) Int. Cl.[7] .............................................. G01R 33/032
(52) U.S. Cl. ........................ 324/96; 324/244.1; 359/280
(58) Field of Search ................................ 324/96, 244.1, 324/117 R; 356/72; 359/280, 281, 282, 283

(56) References Cited

U.S. PATENT DOCUMENTS 5,136,235 A     8/1992   Brändle et al. ................ 324/96

Primary Examiner—Walter Snow
(74) Attorney, Agent, or Firm—Milton M. Peterson

(57) ABSTRACT

The present invention relates to a device for measuring a current in a magnetic field which includes a glass article wherein the glass may be an oxyfluoride glass or a bismuth oxide glass having a photoelastic coefficient of from about −0.2 to 0.2 at 546 nm. Further, the present invention relates to a method of measuring currents.

28 Claims, 1 Drawing Sheet

FIBER OPTIC, CURRENT MEASURING DEVICES AND METHOD

Figure 1:
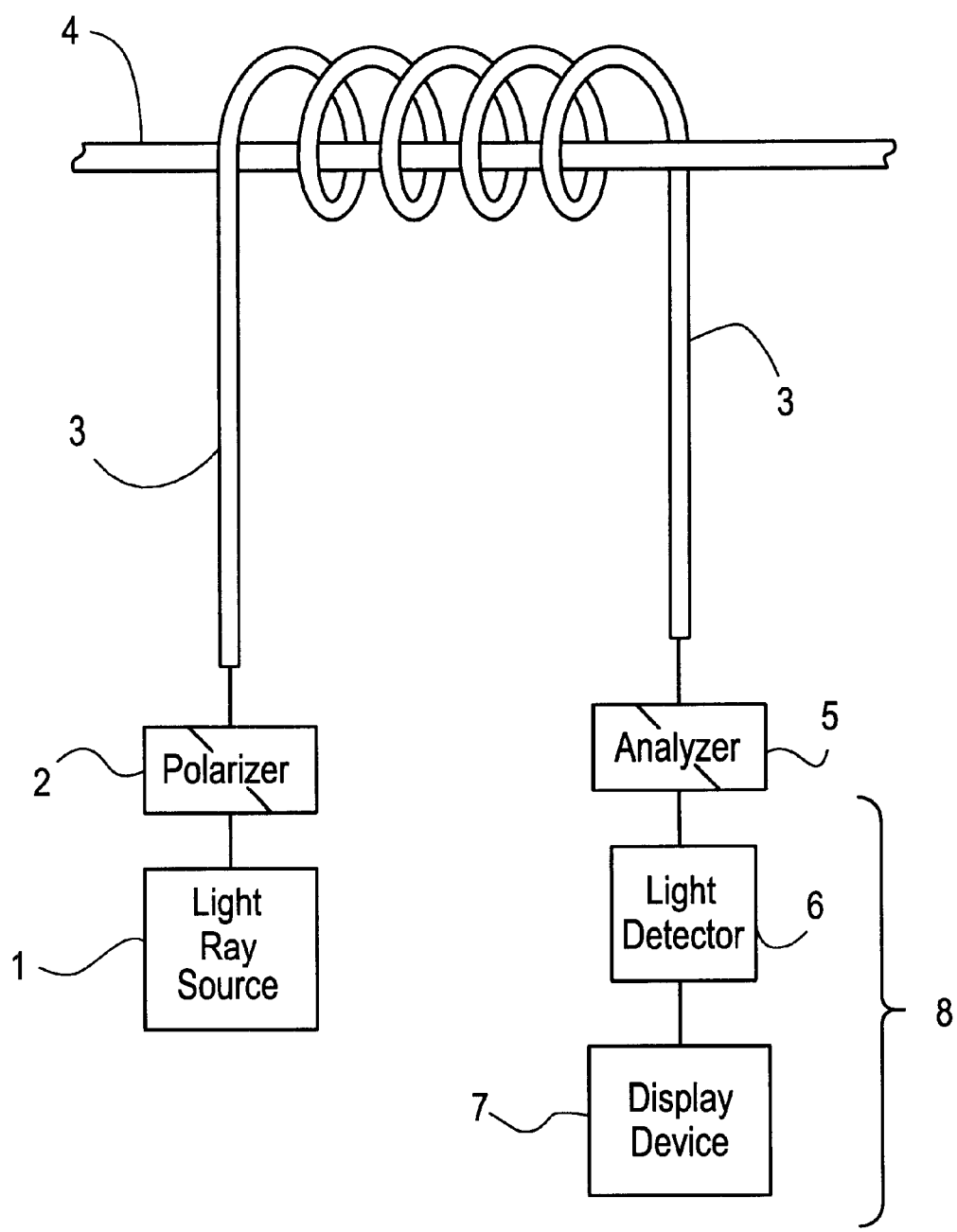

This application claims the benefit of U.S. Provisional Application, Serial No. 60/078,161, filed Mar. 16, 1998 entitled CURRENT MEASURING DEVICES AND METHOD, by B. G. Aitken, N. F. Borrelli, L. K. Cornelius, J. J. Price, and P. A. Tick and PCT Application No. PCT/US99/02752 filed Feb. 9, 1999.

FIELD OF THE INVENTION

The present invention relates to devices and methods for measuring currents.

BACKGROUND OF THE INVENTION

Fiber optic current sensors based on the Faraday effect are attractive for remotely measuring large electrical current, because they have numerous advantages over traditional inductive current transformers. These advantages include wide dynamic range, fast response, immunity to electromagnetic interference, small size, and low cost. Therefore, a variety of fiber optic current sensors have been investigated over the last few years, mainly using silica fibers.

These sensors have not yet reached the stage of practical field use due to lack of accuracy and stability. This is mainly because the Faraday rotation is quenched by intrinsic and induced linear birefringences. These birefringences are easily generated in the silica glass fibers used as a sensing element. Further, these fibers have not been able to accurately measure large currents, such as surge or fault currents.

The Faraday effect is a phenomenon by which a linear, polarized light will rotate when propagating through a transparent material that is placed in a magnetic field in parallel to the magnetic field. The size of the rotation angle (e), given in degrees, is defined as $$\theta = VHL \tag{1}$$

where H is the strength of the magnetic field (A/m), V is the Verdet constant of the material, and L is the path length over which the magnetic field acts (m).

The magnetic field strength is measured in terms of Amperes (A) times turns (T) per unit length (AT/m) where m is meters). Since values are expressed in terms of one turn, this factor is usually implicit, rather than explicit. Hence, the strength is customarily given in amperes (A) or kiloamperes (kA) per unit path length in meters (m).

The Verdet constant, V, is the angle of rotation divided by the magnetic field strength per unit length. The angle may be expressed in any of the customary units for angle measurement, but degrees are used here. Verdet constant values, unless otherwise indicated, are given in terms of degrees divided by field strength expressed as (kA×T/m)m.

The magnitude of the magnetic induction (B) around an infinite straight conductor is given by the expression:

$$B = (\mu_o/4\pi)(2I/a) \tag{2}$$

where I is the current, p is permitivity of free space and a is the radial distance of the magnetic field from the conductor. The magnetic field is related to the magnetic induction by the simple relation:

$$B = \mu_o H. \tag{3}$$

Combining equations 1 through 3 gives the desired relation between the rotation and the current:

$$\theta = VI \tag{4}$$

where θ is in degrees, V is the Verdet constant, and I is in kA. Thus, the sensitivity of a method for measuring the current depends on how accurately one can measure the angular rotation.

The degree of sensitivity in measuring the angular rotation is influenced by another factor; birefringence. Birefringence arises primarily from stresses that result from bending, or otherwise distorting, the fiber in its disposition. The sources of linear birefringence in single mode fibers include residual stress from fabrication, bending, contact, and thermal stresses (Yamashita et al., "Extremely Small Stress-optic Coefficient Glass Single Mode Fibers For Current Sensor", Optical Fiber Sensors, Sapporo Japan, paper We2-4, page 168 (1996) ("Yamashita").

Accordingly, one important feature of a device used to measure current is a single mode optical fiber ("SMF") so that the path can be maintained with a large Faraday effect (i.e. high Verdet constant) and no birefringence.

A glass composition in which no birefringence is produced by any applied stresses is a glass that produces a zero value of the photoelastic effect. The stress-induced birefringence is quantified in terms of a coefficient, called the photoelastic constant (or the photoelastic coefficient). The photoelastic coefficient (Bp) may be defined as the coefficient relating the difference in the refractive indices in the stress direction (n(par)) and in the perpendicular direction (n(per)), to the magnitude of the applied stress:

$$n(par) - n(per) = B_p \sigma \tag{5}$$

It may also be regarded as the phase shift measured in units of wavelength in nanometers (nm) per path length in centimeters (cm) divided by the stress in kilograms per square centimeter (kg/cm²). The values then are in units of (nm/cm divided by kg/cm²).

In some cases, it is also desirable to have a device that measures surge currents via the Faraday effect. This is important, because surge currents, which are unexpected large currents, will cause large angles of rotation. To measure surge currents, it is important to keep the angle of rotation below 90 degrees. With glasses having larger Verdet constants, when a fault current occurs, angles of rotation of greater than 90 degrees would result. These angles of rotation greater than 90 degrees would register the same as an angle of less than 90 degrees. In contrast, a device having a fiber made of a glass having a lower Verdet constant would not have as great an angle of rotation on a fault current. Therefore, it would accurately measure such currents.

Japanese Patent Application No 3-13177 relates to a glass fiber for devices for magnetic field current measurements. The glass has a large Verdet constant and a small photoelastic coefficient. The glass has a core and clad material having the following composition ranges by weight %: 5–28 $SiO_2$, 0–10 $B_2O_3$, 0–5 $Al_2O_3$, 16–28 $SiO_2+B_2O_3+Al_2O_3$, 0.3–2.5 $Na_2O+K_2O$, and 69.5–83.7 PbO.

This glass requires large amounts of lead to produce a zero photoelastic coefficient. Further, the glass of the Japanese application is not suitable for use in measuring surge currents. There, a glass having a smaller Verdet constant, but still having a photoelastic coefficient equal to or approaching zero, is required.

The present invention is directed to providing a current measuring device that overcomes these deficiencies.

SUMMARY OF THE INVENTION

The present invention relates to a device for measuring a current in a magnetic field comprising a glass article having a photoelastic coefficient of from about −0.2 to about 0.2 at 546 nm, the glass being selected from a group of glass families consisting of oxyfluoride and bismuth oxide-containing glasses.

Another aspect of the invention is a method of measuring a current in a magnetic field which comprises providing, as a current sensor, a glass article that has a photoelastic coefficient ranging between about −0.2 to about 0.2 at 546 nm, and that is capable of causing an angular rotation of polarized light propagated through the glass article, the glass being selected from a group of glass families consisting of oxyfluoride and bismuth oxide-containing glasses. The method further comprises passing a current through a conductor which creates a magnetic field surrounding the conductor. The current flows through the current sensor, propagating a polarized light into the glass article. The angle of rotation of the polarized light in the glass article is then determined so that the current can be measured.

The present invention advantageously provides a device having a glass article which has a large Verdet constant and a photoelastic coefficient suitable for measuring electrical currents. In addition, the present invention provides a device which can be used to accurately measure surge currents.

DETAILED DRAWINGS OF THE INVENTION

FIG. 1 illustrates a device according to the present invention.

DETAILED DESCRIPTION OF THE INVENTION

The present invention relates to a device for measuring a current in a magnetic field comprising a glass article having a photoelastic coefficient of from about −0.2 to about 0.2 at 546 nm.

A photoelastic condition at or approaching zero can be achieved at lower Pb concentrations than with other types of glass compositions. In particular, the oxyfluoride glass of the present invention achieves a photoelastic coefficient at or approaching zero with a content of less that 75 wt. % Pb in the form of an oxide or a fluoride in the glass. Preferably, the Pb content is less than about 64 wt. %, with less than approximately 34 wt. % being especially preferred. In comparison, the value of the photoelastic coefficient of approximately zero occurs in a lead oxide glass system at somewhere near 80 wt. % lead.

One desirable glass of the present invention is an oxyfluoride glass that includes 30 to 50 mol. % $SiO_2$, 10 to 20 mol. % $Al_2O_3$, 0–5 mol. % $YF_3$ 27–33 mol. % $PbF_2$, 0–5 mol. % $ZnF_2$ and 10–30 mol. % $CdF_2$.

A second desirable oxyfluoride glass of the present invention includes 28–34 mol. % $AlF_3$, 27.5 to 30.5 mol. % $PbF_2$, 5 to 8 mol. % LiF, 2–6 mol. % KF, 4 to 6.5 mol. % $YF_3$, 11–14 mol. % $CdF_2$, and 10 to 14 mol. % CdO. Optionally, 0–10% $LaF_3$ is included. Glasses in this family are generally described in U.S. Pat. No. 4,752,593 to Tick, which is hereby incorporated by reference.

The oxyfluoride glasses of the present invention have photoelastic constants approaching zero. In particular, the oxyfluoride glasses have a photoelastic constant ranging from about −0.2 to about 0.2 at 546 nm. Preferably, the photoelastic constant is zero. In addition, the oxyfluoride glasses have Verdet constants ranging between 0.20 to 0.35 degrees/(kA−T/m)m at 1150 nm.

Typically, the oxyfluoride glasses containing $SiO_2$ and $Al_2O_3$ have Verdet constants ranging from about 0.20 to 0.33 degrees /(kA−T/m)m as 1150 nm, while the glasses disclosed in the Tick patents have slightly higher Verdet constants.

A second embodiment of the present invention is an oxide glass having a photoelastic constant approaching zero. The oxide glass includes 45 to 65 mol. % $Bi_2O_3$, 0 to 40 mol. % MO, 0 to 25 mol. % $M'_2O$, 0 to 30 mol. % $B_2O_3$, 0 to 35 mol. % $SiO_2$, 0 to 20 mol. % $GeO_2$, and 0 to 30 mol. % $Ga_2O_3$, where M is Zn, Cd, Be, Mg, Ca, Sr, or Ba and M' is Li, Na, K, Rb or Cs. Additionally, the glass may include 0 to 30 mol. % PbO, 0 to 20 mol. % $Tl_2O$, where PbO+$Tl_2O$ is 0 to 30 mol. %. Preferably, the sum of the oxides of boron, silicon, gallium, and germanium equal from 10 to 35 mol. %. Preferably, M' is K, Na, or Li, and M is Zn, Cd, or Ba.

The oxide glass of the present invention utilizes bismuth, rather than lead, to obtain a photoelastic constant approaching zero. However, more bismuth is needed on a cation basis than lead to produce a glass having a photoelastic constant approaching zero. Since the Verdet constant of Bi is comparable to that of Pb, the net effect is to produce a glass having a larger Verdet constant at the desired photoelastic point.

The oxide glasses of the present invention have photoelastic constants equal to or approaching zero. In particular, the oxide glasses have a photoelastic constant ranging from about −0.2 to about 0.2 at 546 nm. Preferably, the photoelastic constant is zero. In addition, the oxide glasses have Verdet constants ranging from about 0.60 to 0.90 degrees/ (kA−T/m)m at 1150 nm.

The oxyfluoride glasses of the present invention are produced by mixing the desired components together and charging them into platinum crucibles. The glass batch is heated at a temperature of from about 1000° to about 1200° C. in air or nitrogen for from about 0.25 to about 0.75 hours, or longer, depending on the particular composition and size of the batch, to achieve melting. The glass melt is then formed into a glass shape by typical procedures such as casting, rolling, or pressing. The glass shape is annealed at about 300° C. to about 400° C. for about 1 hour.

The oxide glasses of the present invention are produced by mixing the desired components together and heating at a temperature from about 800° C. to about 1200° C. for from about 0.25 to about 0.75 hours to achieve melting.

The glass melt is cast and annealed near the glass transition temperature for about 1 hour.

The glasses of the present invention can be produced into fibers using standard techniques. For example, the fiber may be prepared by using a glass within the desired composition ranges to first form a preform by the rod-in-tube method. Then, the preform is fiber drawn.

One alternative for obtaining the required refractive index difference between the core and the cladding of the fiber would be to replace a small amount of the lead component in the core glass composition, with Si to produce the cladding glass composition. However, by replacing Pb with Si, the cladding now does not have a photoelastic coefficient approaching or equal to zero. Thus, light which is carried in the cladding would be subject to birefringence.

Accordingly, a better approach is to replace the Pb with a heavy metal ion. This will give a cladding having a lower refractive index, while still having a photoelastic coefficient of about zero. This can be done by replacing the Pb in the cladding composition with highly polarizable ions, such as Bi and Tl.

Likewise, the bismuth in the oxide core glass composition may be replaced by a heavy metal ion, such as Pb or Tl to produce a cladding glass composition. The fiber then has the required refractive index difference between the core and the cladding, and also has a cladding having a photoelastic coefficient approaching zero.

The glasses as described above can be used in sensors to measure a current using the Faraday effect. Sensors utilizing various glass articles are generally described in U.S. Patent No. 3,605,013 to Yoshikawa et al.,; Sato et al., "Development and Application of Bulk-Optic Current Sensors," Optical Fiber Sensors, Sapporo, Japan, pages 130–133 (1996); Sone, "Ring Glass Type Faraday Effect Current Sensor," Optical Fiber Sensors, Sapporo, Japan, pages 144–145 (1996), which are hereby incorporated by reference. In particular, the glasses are used in devices for measuring a current in a magnetic field.

For example, the device may be a current sensor, a use for which the oxide glasses of the present invention are particularly suitable. The oxide glasses of the present invention have a high cation portion of bismuth to achieve a zero photoelastic constant. Therefore, they have a higher Verdet constant than glasses that utilize lead to impart a high Verdet constant. Thus, greater sensitivity is provided in the sensor, as compared to a sensor containing a glass having a lower Verdet constant.

In contrast, the oxyfluoride glasses utilize relatively low levels of lead to achieve a zero photoelastic coefficient. Accordingly, they will have a correspondingly lower Verdet constant. As such, these glasses are especially useful for the measurement of a surge or fault current, where it is desired to obtain angles of rotation of less than 90 degrees.

A device having a fiber made of a glass having a lower Verdet constant would not have as great an angle of rotation on a fault current. Therefore, it would register an angular rotation of 90 degrees or less. In particular, a device, which includes a fiber containing the oxide glass of the present invention, would have less than 90 degrees rotation where the Verdet constant is less than 0.45 degrees/kA and the maximum current is 200 kA.

FIG. 1 illustrates an embodiment of the device of the present invention. Preferably, a fiber 3, as described above, is utilized. However, any glass article, such as a piece of bulk glass (not shown), can be used. Fiber 3 acts as a path for the polarized light. Conductor 4 carries the current to produce a magnetic field. Preferably, fiber 3 is wrapped around conductor 4, as shown, to increase the length of the light path. Also, it is preferable that fiber 3 be insulated from the conductor.

The device also includes a source of light rays 1, the source being located such that light rays are directed to an input end of fiber 3. Typically, the source of light rays 1 is a laser. A polarizer 2 is located adjacent to source of light rays 1 such that the light rays are linearly polarized. An analyzer 5 is located at an output end of fiber 3 to provide an output.

Analyzer 5 derives a rotatory polarization component produced in proportion to the current flowing through the conductor 4. Also included is a means 8 for indicating the measured current corresponding to the output of analyzer 5. Typically, the means 8 is a light detector 6, and a display device 7.

Light detector 6 receives and detects the output of analyzer 5. Device 7 receives the output of, and provides a display of, the output of the light detector 6.

Optionally, the analyzer may be a Wollaston prism, as described in Yamashita. Then, the light ray output from the fiber is broken into two orthogonal polarizations. Means 8 detects the output of each signal and indicates the measured current corresponding to the output.

The present invention also relates to a method of measuring a current in a magnetic field. The method comprises providing a current sensor which includes a glass article, such as a fiber or a bulk piece of glass block. The glass of the article is either an oxyfluoride glass or a bismuth oxide glass of the present invention. The glass has a photoelastic coefficient of from about −0.2 to about 0.2 at 546 nm, and is capable of causing an angular rotation of polarized light propagated through a fiber. The method further comprises passing a current through a conductor which creates a magnetic field surrounding the conductor. The current flows through the current sensor, propagating a polarized light into the glass article. The angle of rotation of the polarized light in the glass article is then determined so that the current can be measured.

The invention is further described with respect to exemplary glasses, the compositions of which are set forth in calculated mol % in TABLES 1–3. Glass batches, based on the compositions of TABLES 1–3, were formulated, mixed and melted. Test pieces were prepared from each glass for measurement of photoelastic coefficient and Verdet constant values. The measured values are set forth in TABLES 1–3 in units of (nm/cm)/(kgcm$^2$) and degrees/(kA-T/m)m, respectively.

Glasses, having the compositions shown in TABLES 1–3, were prepared as follows:

TABLE 1 glasses: The batch ingredients were mixed and charged into platinum crucibles. The crucibles were moved to a furnace operating at 1000° C. and the batches were melted in air for 0.5 hours. The melts were poured onto a steel plate to form glass patties, which were annealed at 400° C.

TABLE 2 glass: The batch ingredients were mixed in a double dry box. The batch was placed in a platinum crucible, and melted under nitrogen without exposing either the batch or the melt to air. Melting occurred at 1000° C. for 30 minutes. The molten glass was cast on a steel plate and annealed at 300° C.

TABLE 3 Oxide glasses: The batch ingredients were mixed and charged into platinum crucibles and melted in a furnace at 1000° C. for 0.50 hours. The melt was cast and annealed near the glass transition temperature of the sample.

TABLE 1

| Components | SAMPLE | | |
| --- | --- | --- | --- |
| | 1 | 2 | 3 |
| $SiO_2$ (mol %) | 30 | 30 | 30 |
| $Al_2O_3$ (mol %) | 15 | 15 | 15 |
| $CdF_2$ (mol %) | 16.5 | 21.9 | 29 |
| $PbF_2$ (mol %) | 37.4 | 32 | 17 |
| $YF_3$ (mol %) | 1.1 | 1.1 | 4 |
| $ZnF_2$ (mol %) | — | — | 5 |
| Photoelastic coefficient | −0.56 | −0.18 | 1.1 |
| Verdet constant | 0.31 | 0.23 | 0.39 |

Note:
Photoelastic coefficient values are measured at 546 nm in (nm/cm)/(kg/cm$^2$).
Verdet constant values are measured at 1150 nm in degrees/kA.

Glass compositions 1 and 3 are comparative compositions that show the effect of varying metal fluoride constituents, in particular $CdF_2$ and $PbF_2$ contents. It is apparent that an increase in $CdF_2$, and a decrease in $PbF_2$, content tends to increase the photoelastic coefficient. This permits tailoring that value while having due regard for the desired Verdet constant.

TABLE 2

| Components | Sample 4 |
|---|---|
| AlF$_3$ (mol %) | 30 |
| PbF$_2$ (mol %) | 30 |
| LiF (mol %) | 6 |
| KF (mol %) | 4 |
| YF$_3$ (mol %) | 4 |
| LaF$_2$ (mol %) | 2 |
| CdF$_2$ (mol %) | 12 |
| CdO (mol %) | 12 |
| photoelastic coefficient | −0.17 |
| Verdet constant | 0.33 |

TABLE 3

| Components | SAMPLE | | | | | |
|---|---|---|---|---|---|---|
| | 5 | 6 | 7 | 8 | 9 | 10 |
| Bi$_2$O$_3$ (mol %) | 55 | 60 | 63 | 62.9 | 52.1 | 45.8 |
| CdO (mol %) | — | — | — | — | 34.7 | 8.3 |
| ZnO (mol %) | 25 | 20 | — | — | — | 12.5 |
| K$_2$O (mol %) | — | — | 12.5 | 14.3 | — | — |
| B$_2$O$_3$ (mol %) | 20 | 20 | — | — | 13.2 | — |
| SiO$_2$ (mol %) | — | — | — | — | — | 33.3 |
| Ga$_2$O$_3$ (mol %) | — | — | 24.5 | 22.9 | — | — |
| PbO (mol %) | — | — | — | — | — | — |
| Tl$_2$O (mol %) | — | — | — | — | — | — |
| PbO + Tl$_2$O | — | — | — | — | — | — |
| photoelastic coefficient | −0.016 | −0.18 | — | — | — | — |
| Verdet constant | 0.69 | — | 0.87 | 0.77 | — | — |

Although the invention has been described in detail for purposes of illustration, it is understood that such detail is solely for that purpose. Variations can be made therein by those skilled in the art without departing from the spirit and scope of the invention, which is defined by the following claims.

What is claimed:

1. A device for measuring a current in a magnetic field comprising a glass article having a photoelastic coefficient of from about −0.2 to about 0.2 at 546 nm, the glass being selected from a group of glass families consisting of oxyfluoride and bismuth oxide-containing glasses.

2. The device according to claim 1, wherein the article is either a fiber or bulk glass.

3. The device according to claim 2, wherein the glass article is a fiber.

4. The device according to claim 3 wherein said fiber has an input end, and an output end, and the device further comprises:
   a current conductor around which said fiber is wrapped,
   a source of light rays, said source being located such that light rays are directed to said input end of said fiber,
   a polarizer so located between said source of light rays and said input end of said fiber that said light rays entering said fiber are linearly polarized;
   an analyzer located at the output end of said fiber for providing an output corresponding to an angle of rotation of said light rays; and
   a means for indicating the measured current corresponding to the output of said analyzer.

5. The device according to claim 1, wherein the photoelastic coefficient is about zero.

6. The device according to claim 1, wherein the glass is an oxyfluoride glass having a Verdet constant of from about 0.20 to about 0.33 degrees/(kA−T/m)m at 1150 nm.

7. The device according to claim 6, wherein the oxyfluoride glass composition contains less than 64 wt. % PbF$_2$.

8. The device according to claim 7, wherein the oxyfluoride glass composition comprises 30 to 50 mol. % SiO$_2$, 0 to 8 mol. % Al$_2$O$_3$, 0 to 5 mol. % YF$_3$, 27 to 33 mol. % PbF$_2$, 0–5% ZnF$_2$ and 10–30% CdF$_2$.

9. The device according to claim 7, wherein the oxyfluoride glass composition comprises 28–34 mol. % AlF$_3$, 27.5 to 30.5 mol. % PbF$_2$, 5 to 8 mol. % LiF, 2–6 mol. % KF, 4 to 6.5 mol. % YF$_3$, 11–14 mol. % CdF$_2$, and 10 to 14 mol. % CdO.

10. The device according to claim 9 wherein the oxyfluoride glass composition further comprises 0–10 mol. % LaF$_3$.

11. A device according to claim 1 wherein the glass is an oxide glass which comprises 45 to 65 mol. % Bi$_2$O$_3$, 0 to 40 mol. % MO, 0 to 25 mol. % M'$_2$O, 0 to 30 mol. % B$_2$O$_3$, 0 to 35 mol. % SiO$_2$, 0 to 20 mol. % GeO$_2$, and 0 to 30 mol. % Ga$_2$O$_3$, where M is Zn, Cd, Be, Mg, Ca, Sr, or Ba, M' is Li, Na, K, Rb, or Cs; and wherein the oxide glass has a photoelastic coefficient of from about −0.2 to about 0.2 at 546 nm.

12. The device according to claim 11, wherein the oxide glass further comprises 0 to 30 mol. % PbO and 0 to 20 mol. % Tl$_2$O, wherein PbO+Tl$_2$O equals 0 to 30 mol. %.

13. The device according to claim 11, wherein the sum of the oxides of boron, silicon, gallium, and germanium is from 10 to 35 mol. %.

14. The device according to claim 11, wherein the article has a Verdet constant which only allows for a Faraday effect of less than 90°, wherein the Verdet constant is less than 0.45 degrees/(kA−T/m)m and the maximum current is 200 kA.

15. The device according to claim 11, wherein the oxide glass has a Verdet constant of from about 0.60 to about 0.90 degrees/(kA−T/m)m at 1150 nm.

16. A method of measuring a current in a magnetic field which comprises:
   providing, as a current sensor, a glass article that has a photoelastic coefficient of from about −0.2 to about 0.2 at 546 nm, that is capable of causing an angular rotation of polarized light propagated through said fiber and that is a glass selected from a group of glass families consisting of oxyfluoride and bismuth oxide-containing glasses;
   passing a current through a conductor, which creates a magnetic field surrounding the conductor, wherein the current flows through the current sensor;
   propagating a polarized light into said fiber; and
   determining the angle of rotation of said polarized light in said fiber, so that said current can be measured.

17. The method according to claim 16, wherein the selected glass is an oxyfluoride glass that comprises less than 64 wt. % PbF$_2$.

18. The method according to claim 17, wherein the oxyfluoride glass comprises 30 to 50 mol. % SiO$_2$, 10 to 20 mol. % Al$_2$O$_3$, 0 to 5 mol. % YF$_3$, 27 to 33 mol. % PbF$_2$, 0–5% ZnF$_2$ and 10–30% CdF$_2$.

19. The method according to claim 17, wherein the oxyfluoride glass comprises 28–34 mol. % AlF$_3$, 27.5 to 30.5 mol. % PbF$_2$, 5 to 8 mol. % LiF, 2–6 mol. % KF, 4 to 6.5 mol. % YF$_3$, 11–14 mol. % CdF$_2$, and 10 to 14 mol. % CdO.

20. The method according to claim 17 wherein the oxyfluoride glass has a Verdet constant of from about 0.20 to about 0.33 degrees/(kA–T/m)m at 1150 nm.

21. The method according to claim 16, wherein the glass article is a fiber that comprises:
   a core and
   a cladding surrounding the core, the cladding having a refractive index lower than that of the core.

22. The method according to claim 16 which comprises propagating the polarized light by a laser.

23. The method according to claim 16, which comprises determining the angle of rotation by:
   detecting an output of said fiber which corresponds to said angle of rotation, with an analyzer, and
   indicating the measured current which corresponds to said output.

24. A method according to claim 16 wherein the selected glass is a bismuth-oxide glass, wherein the oxide glass comprises 45 to 65 mol. % $Bi_2O3$, 0 to 40 mol. % MO, 0 to 25 mol. % $M'_2O$ 0 to 30 mol. % $B_2O_3$, 0 to 35 mol. % $SiO_2$0 to 20 mol. % $GeO_2$, and 0 to 30 mol. % $Ga_2O_3$
   where M is Zn, Cd, Be, Mg, Ca, Sr, or Ba, M' is Li, Na, K, Rb, or Cs.

25. The method according to claim 24, wherein the oxide glass further comprises 0 to 30 mol. % PbO and 0 to 20 mol. % $Tl_2O$, wherein PbO+$Tl_2O$ equals 0 to 30 mol. %.

26. The method according to claim 25, wherein the sum of the oxides of boron, silicon, gallium, and germanium is from 10 to 35 mol. %.

27. The method according to claim 24, wherein the glass article has a Verdet constant which only allows for a Faraday effect of less than 90°, wherein the Verdet constant is less than 0.45 degrees/(kA–T/m)m and the maximum current is 200 kA.

28. The method according to claim 24, wherein the silica glass has a Verdet constant of from about 0.60 to about 0.90 degrees/(kA–T/m)m at 1150 nm.

* * * * *